United States Patent
Kuznetsov

(10) Patent No.: US 12,355,208 B2
(45) Date of Patent: Jul. 8, 2025

(54) TUNABLE VCSEL WITH STRAIN COMPENSATED SEMICONDUCTOR DBR

(71) Applicant: Excelitas Technologies Corp., Waltham, MA (US)

(72) Inventor: Mark E. Kuznetsov, Lexington, MA (US)

(73) Assignee: Excelitas Technologies Corp., Waltham, MA (US)

( * ) Notice: Subject to any disclaimer, the term of this patent is extended or adjusted under 35 U.S.C. 154(b) by 882 days.

(21) Appl. No.: 17/450,918

(22) Filed: Oct. 14, 2021

(65) Prior Publication Data

US 2022/0115838 A1    Apr. 14, 2022

Related U.S. Application Data

(60) Provisional application No. 63/091,412, filed on Oct. 14, 2020.

(51) Int. Cl.
*H01S 5/183*    (2006.01)
*H01S 5/068*    (2006.01)
*H01S 5/34*     (2006.01)

(52) U.S. Cl.
CPC .......... *H01S 5/18377* (2013.01); *H01S 5/068* (2013.01); *H01S 5/34* (2013.01)

(58) Field of Classification Search
CPC ......... H01S 5/18–187; H01S 5/42–426; H01L 33/10; H01L 33/46; G02B 5/08; G02B 5/0816; G02F 2201/346
See application file for complete search history.

(56) References Cited

U.S. PATENT DOCUMENTS 5,052,016 A * 9/1991 Mahbobzadeh ....... B82Y 20/00
                                                     372/92
5,481,397 A    1/1996 Burt
(Continued)

FOREIGN PATENT DOCUMENTS

| CN | 114204404 | * | 3/2022 | ......... H01S 5/02345 |
|----|-----------|---|--------|------------------------|
| EP | 0641031   | * | 3/1995 | ............ H01L 33/00 |
| EP | 1 980 001 B1 |  | 2/2007 | |

OTHER PUBLICATIONS

International Preliminary Report on Patentability for International Application No. PCT/US2021/071874 mailed Apr. 27, 2023.
(Continued)

*Primary Examiner* — Xinning (Tom) Niu
*Assistant Examiner* — Delma R Forde
(74) *Attorney, Agent, or Firm* — Wolf, Greenfield & Sacks, P.C.

(57) ABSTRACT

Tunable VCSELs (TVCSELs) employing expanded material systems with expanded mechanical/optical design space for semiconductor DBR mirrors on GaAs substrates. One is the InGaAs/AlGaAsP material system. It adds indium In to decrease InGaAs H-layer bandgap for higher refractive index and higher DBR layer refractive index contrast. Adding phosphorus P gives independent control of bandgap and strain of AlGaAsP low refractive index L-layers. The tensile strain of AlGaAsP L-layer compensates compressive strain of InGaAs H-layer and lowers the cumulative strain of the multilayer DBR structure. Another option is the InGaAsN (Sb)/AlGaAsP material system, where both types of layers can be lattice matched to GaAs. It uses indium In and nitrogen N, and possibly antimony Sb, to get independent control of strain and bandgap, and thus refractive index, of (Continued)

| DBR Design Wav, nm | 1050 | | |
|---|---|---|---|
| Layer # | Type | Material | Repeat |
| 21 | Win-2 | InGap | |
| 20 | Win-1 | Al(x)Ga(1-x)As | |
| 19 | Mirr_L_GEDBR | Ga(x)Al(1-x)As(1-y)P(y) | |
| 18 | Mirr_H_GEDBR | GaAs | |
| 17 | QWell | In(x)Ga(1-x)As | |
| 16 | Mirr_H_GEDBR | GaAs | |
| 15 | Mirr_L_GEDBR | Ga(x)Al(1-x)As(1-y)P(y) | |
| 14 | Mirr_H_GEDBR | GaAs | |
| 13 | QWell | In(x)Ga(1-x)As | |
| 12 | Mirr_H_GEDBR | GaAs | |
| 11 | Mirr_L_GEDBR | Ga(x)Al(1-x)As(1-y)P(y) | |
| 10 | Mirr_H_GEDBR | GaAs | |
| 9 | QWell | In(x)Ga(1-x)As | |
| 8 | Mirr_H_GEDBR | GaAs | |
| 7 | Mirr_L_GEDBR | Ga(x)Al(1-x)As(1-y)P(y) | |
| 6 | Mirr_H_GEDBR | GaAs | |
| 5 | QWell | In(x)Ga(1-x)As | |
| 4 | Mirr_H_GEDBR | GaAs | |
| 3 | Mirr_L_GEDBR+ | Ga(x)Al(1-x)As(1-y)P(y) | |
| 2 | Mirr_H | In(x)Ga(1-x)As | 45 |
| 1 | Mirr_L | Ga(x)Al(1-x)As(1-y)P(y) | 45 |
| 0 | Substrate | GaAs | | dilute nitride InGaAsN(Sb) H-layers, with lower bandgap and higher refractive index than starting GaAs. Using expanded material system enables reliable DBR mirrors with higher reflectivity and spectral bandwidth and tunable VCSELs with wider tuning range.

10 Claims, 5 Drawing Sheets

(56) References Cited

U.S. PATENT DOCUMENTS

| | | | |
|---|---|---|---|
| 9,762,031 | B2 | 9/2017 | Makino et al. |
| 10,109,979 | B2 | 10/2018 | Flanders et al. |
| 10,263,394 | B2 | 4/2019 | Jayaraman et al. |
| 2004/0228381 | A1 | 11/2004 | Jikutani et al. |
| 2005/0184303 | A1 | 8/2005 | Tandon et al. |
| 2010/0014551 | A1 | 1/2010 | Onishi et al. |
| 2016/0329682 | A1 | 11/2016 | Flanders et al. |
| 2019/0348815 | A1 | 11/2019 | Johnson et al. |
| 2019/0386461 | A1 | 12/2019 | Johnson et al. |
| 2021/0050712 | A1* | 2/2021 | Johnson .............. H01S 5/18366 |
| 2022/0311213 | A1* | 9/2022 | Johnson ................. H01S 5/068 |

OTHER PUBLICATIONS

Drexler, W., et al., "Introduction to Optical Coherence Tomography," in [Optical Coherence Tomography: Technology and Applications, First Edition], Drexler, W. and Fujimoto, J. G., eds., ch. 1, 1-40, Springer (2008).

Jayaraman, V., et al., "VCSEL swept light sources," Optical Coherence Tomography: Technology and Applications, Second Edition, 659-686 (2015).

Johnson, B. et al., "Tunable 1060nm VCSEL co-packaged with pump and SOA for OCT and LiDAR," SPIE Photonics West BiOS Proceedings, 1086706-1-1086706-10 (2019).

Knopp, K., et al., "High power MEMs-tunable vertical-cavity surface-emitting lasers," 2001 Digest of LEOS Summer Topical Meetings, TuA1.3, 31-32 (2001).

Matsui, Y., et al., "Complete polarization mode control of long-wavelength tunable vertical-cavity surface-emitting lasers over 65-nm tuning, up to 14-mw output power," IEEE J. Quantum Electronics, 39(9): 1037-1048 (2003).

International Search Report and Written Opinion of the International Searching Authority, mailed on Feb. 22, 2022, from International Application No. PCT/US2021/071874, filed on Oct. 14, 2021. 16 pages.

Guina, M., et al., "Molecular Beam Epitaxy of Dilute Nitride Optoelectronic Devices," in "Molecular Beam Epitaxy", second edition, Mohamed Henini ed., Elsevier Inc, 73-94 (2018).

* cited by examiner

| DBR Design Wav, nm | 1050 | | |
|---|---|---|---|
| Layer # | Type | Material | Repeat |
| 21 | Win-2 | InGap | |
| 20 | Win-1 | Al(x)Ga(1-x)As | |
| 19 | Mirr_L_GEDBR | Ga(x)Al(1-x)As(1-y)P(y) | |
| 18 | Mirr_H_GEDBR | GaAs | |
| 17 | QWell | In(x)Ga(1-x)As | |
| 16 | Mirr_H_GEDBR | GaAs | |
| 15 | Mirr_L_GEDBR | Ga(x)Al(1-x)As(1-y)P(y) | |
| 14 | Mirr_H_GEDBR | GaAs | |
| 13 | QWell | In(x)Ga(1-x)As | |
| 12 | Mirr_H_GEDBR | GaAs | |
| 11 | Mirr_L_GEDBR | Ga(x)Al(1-x)As(1-y)P(y) | |
| 10 | Mirr_H_GEDBR | GaAs | |
| 9 | QWell | In(x)Ga(1-x)As | |
| 8 | Mirr_H_GEDBR | GaAs | |
| 7 | Mirr_L_GEDBR | Ga(x)Al(1-x)As(1-y)P(y) | |
| 6 | Mirr_H_GEDBR | GaAs | |
| 5 | QWell | In(x)Ga(1-x)As | |
| 4 | Mirr_H_GEDBR | GaAs | |
| 3 | Mirr_L_GEDBR+ | Ga(x)Al(1-x)As(1-y)P(y) | |
| 2 | Mirr_H | In(x)Ga(1-x)As | 45 |
| 1 | Mirr_L | Ga(x)Al(1-x)As(1-y)P(y) | 45 |
| 0 | Substrate | GaAs | |

Fig. 3

| DBR Design Wav, nm | 1050 | | |
|---|---|---|---|
| Layer # | Type | Material | Repeat |
| 21 | Win-2 | InGap | |
| 20 | Win-1 | Al(x)Ga(1-x)As | |
| 19 | Mirr_L_GEDBR | Ga(x)Al(1-x)As(1-y)P(y) | |
| 18 | Mirr_H_GEDBR | GaAs | |
| 17 | QWell | In(x)Ga(1-x)As | |
| 16 | Mirr_H_GEDBR | GaAs | |
| 15 | Mirr_L_GEDBR | Ga(x)Al(1-x)As(1-y)P(y) | |
| 14 | Mirr_H_GEDBR | GaAs | |
| 13 | QWell | In(x)Ga(1-x)As | |
| 12 | Mirr_H_GEDBR | GaAs | |
| 11 | Mirr_L_GEDBR | Ga(x)Al(1-x)As(1-y)P(y) | |
| 10 | Mirr_H_GEDBR | GaAs | |
| 9 | QWell | In(x)Ga(1-x)As | |
| 8 | Mirr_H_GEDBR | GaAs | |
| 7 | Mirr_L_GEDBR | Ga(x)Al(1-x)As(1-y)P(y) | |
| 6 | Mirr_H_GEDBR | GaAs | |
| 5 | QWell | In(x)Ga(1-x)As | |
| 4 | Mirr_H_GEDBR | GaAs | |
| 3 | Mirr_L_GEDBR+ | Ga(x)Al(1-x)As(1-y)P(y) | |
| 2 | Mirr_H | In(x)Ga(1-x)As(1-v)N(v) | 45 |
| 1 | Mirr_L | Ga(x)Al(1-x)As(1-y)P(y) | 45 |
| 0 | Substrate | GaAs | |

Fig. 5

TUNABLE VCSEL WITH STRAIN COMPENSATED SEMICONDUCTOR DBR

RELATED APPLICATIONS

This application claims the benefit under 35 USC 119(e) of U.S. Provisional Application No. 63/091,412, filed on Oct. 14, 2020, which is incorporated herein by reference in its entirety.

BACKGROUND OF THE INVENTION

Tunable vertical cavity surface emitting lasers (VCSELs) with microelectromechanical (MEMS) movable mirrors have found application in telecommunications, Matsui, Y., Vakhshoori, D., Wang, P., Chen, P., Lu, C.-C., Jiang, M., Knopp, K., Burroughs, S., and Tayebati, P., "Complete polarization mode control of long-wavelength tunable vertical-cavity surface-emitting lasers over 65-nm tuning, up to 14-mw output power," IEEE J. Quantum Electronics 39, 1037-1048 (2003) and Knopp, K., Vakhshoori, D., Wang, P., Azimi, M., Jiang, M., Chen, P., Matsui, Y., McCallion, K., Baliga, A., Sakhitab, F., Letsch, M., Johnson, B., Huang, R., Jean, A., DeLargy, B., Pinzone, C., Fan, F., Liu, J., Lu, C., Zhou, J., Zhu, H., Gurjar, R., Tayebati, P., MacDaniel, D., Baorui, R., Waterson, R., and Van der Rhodes, G., "High power MEMs-tunable vertical-cavity surface-emitting lasers," in [2001 Digest of LEOS Summer Topical Meetings], TuA1.3, 31-32 (2001). They have also found application in optical coherence tomography (OCT). See for example B. Johnson, W. Atia, S. Woo, C. Melendez, M. Kuznetsov, T. Ford, N. Kemp, J. Jabbour, E. Mallon, P. Whitney, "Tunable 1060 nm VCSEL co-packaged with pump and SOA for OCT and LiDAR," SPIE Photonics West BiOS Proceedings, 10867 (2019) and Flanders, D. C., Kuznetsov, M. E., Atia, W. A., and Johnson, B. C., "OCT system with bonded MEMS tunable mirror VCSEL swept source." US Patent application Pub. No. US2016/0329682 A1 (10 Nov. 2016).

To date, most swept source OCT applications occur in the 1310 nanometer (nm) and 1060 nm bands. And, for OCT, it is very important to achieve the widest tuning range in optical frequency since the depth resolution in OCT is inversely proportional to the tuning range. See J. Fujimoto and W. Drexler, "Introduction to Optical Coherence Tomography," in [Optical Coherence Tomography: Technology and Applications, First Edition], Drexler, W. and Fujimoto, J. G., eds., ch. 1, 1-40, Springer (2008).

Two of the most important factors affecting a VCSEL's tuning range are the (1) bandwidths of the laser cavity mirrors and (2) the laser cavity length. Much work has gone into broad-band mirror technology, including high-refractive-index-contrast dielectric mirrors and GaAs/oxidized AlAs mirrors. See Jayaraman, V., Jiang, J., Potsaid, B., Robertson, M., Heim, P. J. S., Burgner, C., John, D., Cole, G. D., Grulkowski, I., Fujimoto, J. G., Davis, A. M., and Cable, A. E., "VCSEL swept light sources," in [Optical Coherence Tomography: Technology and Applications, Second Edition], Drexler, W. and Fujimoto, J. G., eds., ch. 22, 659-686, Springer (2015). The GaAs/AlAs material system natively has fairly high achievable index contrast, ratio of the high to low refractive index of selected materials, allowing epitaxially-grown distributed Bragg reflector (DBR) mirrors supporting tuning ranges on the order of 100 nm.

SUMMARY OF THE INVENTION

Nevertheless, tuning ranges in excess of 100 nm require improved epitaxially-grown mirrors. In general, there is a need for semiconductor DBRs with higher reflectivity, broader spectral width, and fewer layers.

Improvements can be achieved by DBR mirror layers with higher refractive index contrast. Semiconductor materials with high bandgap energies have low refractive indices, while materials with low bandgaps have high refractive indices. One way of getting higher DBR index contrast is by lowering bandgap of the DBR high-refractive-index H-layers and increasing bandgap of the DBR low-refractive-index L-layers. This can be achieved by expanding the material space for semiconductor DBR mirrors on GaAs substrates beyond AlGaAs Moreover, both bandgap and strain of the DBR mirror layers have to be considered and controlled. The approach here can include full control over the DBR structure strain either by balancing compressive and tensile strain of alternating mirror layers, or by using mirror layer materials lattice matched to the substrate.

Specific examples for DBR mirrors on GaAs substrates include InGaAs/GaAlAsP (strain-balanced) or InGaAsN/GaAlAsP (lattice matched).

In general terms, this approach could be applied to other semiconductor systems, not just on GaAs, such as InP and GaSb.

Moreover, in general terms this approach could be further applied to optically and electrically pumped VCSELs, tunable and non-tunable devices, passive and active devices.

In summary, tunable VCSELs (TVCSELs) employing expanded material systems for semiconductor DBR mirrors on GaAs substrates can achieve improved performance. Standard systems relying on GaAs/AlGaAs generally have limited H/L DBR refractive index contrast and built-in cumulative strain of multiple layers and limited DBR mirror spectral reflection bandwidth and TVCSEL tuning range.

One option on GaAs substrates is the InGaAs/AlGaAsP material system. It adds indium In to GaAs layers to decrease InGaAs H-layer bandgap for higher refractive index and higher DBR refractive index contrast. Adding phosphorus P to AlGaAs layers controls strain of AlGaAsP L-layer strain. The tensile strain of AlGaAsP L-layers compensates compressive strain of InGaAs H-layers and lowers the cumulative strain of the multilayer DBR structure.

This provides an increased DBR mirror spectral reflection bandwidth and TVCSEL tuning range. For example, DBR mirror bandwidth increased from 101.5 nm for standard DBR to 104.5 nm (Laser tuning range 103.7 nm), in one specific design. Here mirror bandwidths are measured at 99.5% reflectivity level.

Another option on GaAs is the InGaAsN/AlGaAsP material system. It uses indium In and nitrogen N to get independent control of strain and bandgap of dilute InGaAsN H-layers, with lower bandgap and higher refractive index than starting GaAs. This can produce lattice matched H-layers on GaAs. Frequently, some amount of antimony Sb is also added to dilute nitride InGaAsN. Such quinary alloys InGaAsNSb allow epitaxial growth of lower defect and higher quality heterostructures on GaAs with bandgaps down to 0.8 eV. The use of phosphorus P in AlGaAsP can produce lattice matched L-layers on GaAs. This approach resulted in an increased DBR refractive index contrast, DBR mirror spectral reflection bandwidth and TVCSEL tuning range. For example, DBR mirror bandwidth increased from 101.5 nm for standard DBR to 109.6 nm (Laser tuning range 108.9 nm).

Yet another option on GaAs is AlGaAs/AlGaAsP, where high aluminum content low refractive index AlGaAsP layers incorporate phosphorus P to lower their compressive strain, or even lattice-match these layers grown on GaAs.

It will be generally understood that, including for the purposes of this invention, ternary, such as (In)GaAs, quaternary, such as GaAlAs(P), and quinary, such as InGaAsN (Sb), materials include compositions where one or more of the constituent chemical elements is present at zero fractional concentration.

In general, according to one aspect, the invention features a laser including a semiconductor distributed Bragg reflector mirror, wherein the mirror comprises layers of InGaAs and layers of AlAsP or GaAlAsP.

Preferably, the layers have alternating compressive/tensile strain on semiconductor substrate. These alternating strain layers can produce substantially low cumulative combined strain on semiconductor substrate.

In some examples, there are additionally quantum well layers for providing gain. These quantum well layers can be interspersed with the (In)GaAs and AlAsP or GaAlAsP layers.

The laser is often a vertical cavity surface emitting laser such as tunable vertical cavity surface emitting laser, possibly with a MEMS membrane including a reflective coating defining an end of the laser cavity.

In general, according to another aspect, the invention features a laser including a semiconductor distributed Bragg reflector mirror, wherein the mirror comprises layers of InGaAsN(Sb) and layers of AlAsP or GaAlAsP.

Quantum well layers can be interspersed with the InGaAsN(Sb) and AlAsP or GaAlAsP layers.

In general, according to another aspect, the invention features a semiconductor distributed Bragg reflector mirror, wherein the mirror comprises layers of InGaAs and layers of AlAsP or GaAlAsP.

In general, according to another aspect, the invention features a semiconductor distributed Bragg reflector mirror, wherein the mirror comprises layers of InGaAsN(Sb) and layers of AlAsP or GaAlAsP.

In general, according to another aspect, the invention features a laser including a semiconductor distributed Bragg reflector mirror, wherein the mirror comprises layers of InGaAs or InGaAsN(Sb) and layers of AlAsP or GaAlAsP.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 3 shows a design for the layer structure of a half VCSEL employing a combined gain and DBR mirror employing a mirror using AlAsP/InGaAs;

FIG. 5 shows a design for the layer structure of a half VCSEL employing a combined gain and DBR mirror, employing InGaAsN and (L) AlAsP based mirrors.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
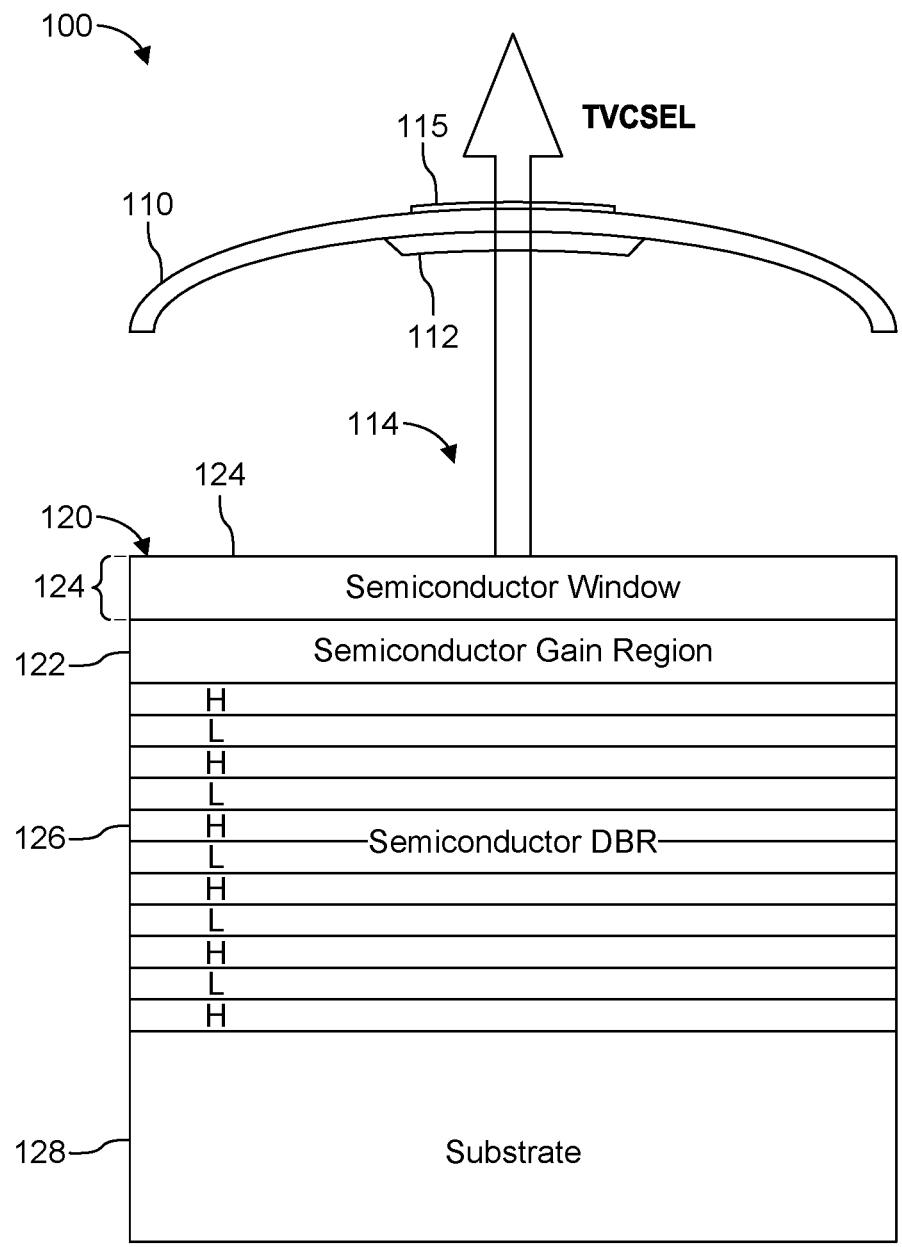
FIG. 1 is a schematic cross sectional view of a tunable vertical-cavity surface-emitting laser (TVCSEL)

FIG. 1 is a schematic cross sectional view of a tunable vertical-cavity surface-emitting laser (TVCSEL) 100.

As a general rule, these devices include a moveable MEMS membrane 100, often fabricated from silicon or a silicon compound. A high reflecting (HR) coating 112 is deposited on this membrane 110 and this coating forms a mirror at one end of the laser cavity. Often, the HR membrane coating 112 has a reflectivity of between 99.0% and 99.9%. An antireflection (AR) coating 115 is typically deposited on the membrane 110 on the opposite side from the HR coating. In a common example, the moveable membrane is electrostatically deflected. Thermally actuated membrane motion has also been used for VCSEL laser tuning.

A half VCSEL device 120 importantly includes a semiconductor gain region 122 which typically includes quantum wells for amplifying the light in the cavity. A semiconductor distributed Bragg reflector (DBR) 126 forms the other mirror of the laser cavity. Light in a VCSEL laser cavity propagates between two mirrors in the direction perpendicular to the semiconductor surface. Typically, a semiconductor window 124 is formed over the gain region 122 for such functions as blocking excited carriers from reaching semiconductor surface, surface passivation, and anti reflection (AR) properties as light moves between the half VCSEL 120 and the air gap 114 that separates the proximal end of the half VCSEL 120 and the inner surface of the HR coating 112. The DBR 126 is formed on a substrate 128.

More specific details of design and fabrication of one exemplary TVCSEL can be found in U.S. Pat. No. 10,109,979, issued on Oct. 23, 2018, by Flanders, Kuznetsov, Atia, and Johnson, which is incorporated herein by this reference. Additional innovations are described in U.S. Pat. Pub. No. US 2019/0348815, published on Nov. 14, 2019, by Johnson, Malonson, Atia, Kuznetsov, Getz, and Whitney, and U.S. Pat. Pub. No. US 2019/0386461, published on Dec. 19, 2019, by Johnson, Kuznetsov, Atia, and Whitney, which are also incorporated herein by this reference.

The semiconductor DBR 126 is formed by alternative high refractive index semiconductor layers (H) and low refractive index semiconductor layers (L). Tunable VCSELs use semiconductor DBR mirror structures with alternating GaAs/AlGaAs, High/Low, H/L refractive index layers formed on a GaAs substrate 128. Large number of H/L pairs is required to achieve high required reflectivity magnitude for these low-gain vertical cavity laser structures, and to achieve spectrally broadband reflectivity, required for broadband wavelength tuning.

Nevertheless, such DBR structures have two properties that limit TVCSEL device performance: material strain and H/L layer refractive index contrast that affect DBR mirror spectral reflection bandwidth.

High cumulative strain of semiconductor DBR structure causes strong epi-wafer bow, limits device reliability and DBR mirror reflectivity bandwidth. High strain in the DBR can affect the strained quantum well gain region on top of the DBR, excess strain could be relieved through generation of dark line defects, causing device degradation. High cumulative strain of the DBR mirror limits the number of H/L layer pairs that can be used in the mirror without generating defects; this limits DBR mirror reflection bandwidth that gets larger with larger number of pairs. Reducing DBR strain can make devices more reliable and increase mirror bandwidth by increasing the number of H/L pairs that can be used reliably.

Limited refractive index contrast between the H and L index semiconductor layers limits DBR mirror spectral bandwidth. DBR mirror spectral bandwidth limits the tuning range of the tunable VCSEL when sufficient gain bandwidth is available.

However, H/L semiconductor materials with higher refractive index contrast can improve the mirror bandwidth, and the TVCSEL laser tuning range can thus be increased. Thus, there is a need for materials with larger H refractive index and lower L refractive index. In addition, the expanded range of semiconductor DBR materials also requires strain control of these materials, when epitaxially grown on GaAs.

For semiconductor materials, smaller energy bandgap gives larger refractive index values. Larger energy bandgap gives smaller refractive index values. Refractive index dispersion, i.e. refractive index variation with wavelength, has to be considered for broadband semiconductor DBR mirrors.

Also, to increase H/L refractive index contrast, H materials with lower bandgaps, L materials with higher bandgaps are needed.

In the GaAs/AlGaAs material system for the DBR, the highest refractive index contrast is achieved for GaAs/AlAs binary compositions and the resulting mirror reflection bandwidth is limited near 100 nanometers (nm). GaAs has lowest and AlAs highest energy bandgap in the AlGaAs material system. For 40 (50) mirror pairs, reflection bandwidth is 98.5 (101.5) nm at the 99.5% DBR reflectivity level. In this material system, grown on a GaAs substrate 128, AlAs also has the highest strain.

Based on this understanding, strain-compensated semiconductor DBR structures can be used to improve the performance of TVCSELs.

In a first innovation, for the H-layers, In is added to shift from GaAs toward InAs, making In(x)Ga(1−x)As layers. This change can provide compressive strain; lower bandgap. H-layers with decreased bandgap increase their refractive index. For the L-layers, P is added to shift from AlAs to AlP, or from AlGaAs to AlGaAsP. These layers are thus characterized by tensile strain, higher bandgap. L-layers with slightly increased bandgap decrease their refractive index, marginally.

As a result, InGaAs/AlAsP (or InGaAs/GaAlAsP) mirrors have increased DBR refractive index contrast, for larger reflection bandwidth; also smaller effective penetration depth, and thus shorter optical cavity when mated with a second mirror. Shorter optical cavity produces larger longitudinal mode spacing, or free spectral range FSR, of the laser optical resonator and is important for tunable lasers, where larger FSR allows potentially larger laser tuning range. In addition, H and L layer compositions can be adjusted to achieve strain balance of the resulting DBR for reduced wafer bow and improved semiconductor structure reliability.

In general in most embodiments, the mirrors for the TVCSEL incorporate more than 40 pairs of H/L layers, such as 45 or 50 or more pairs.

Figure 2A:
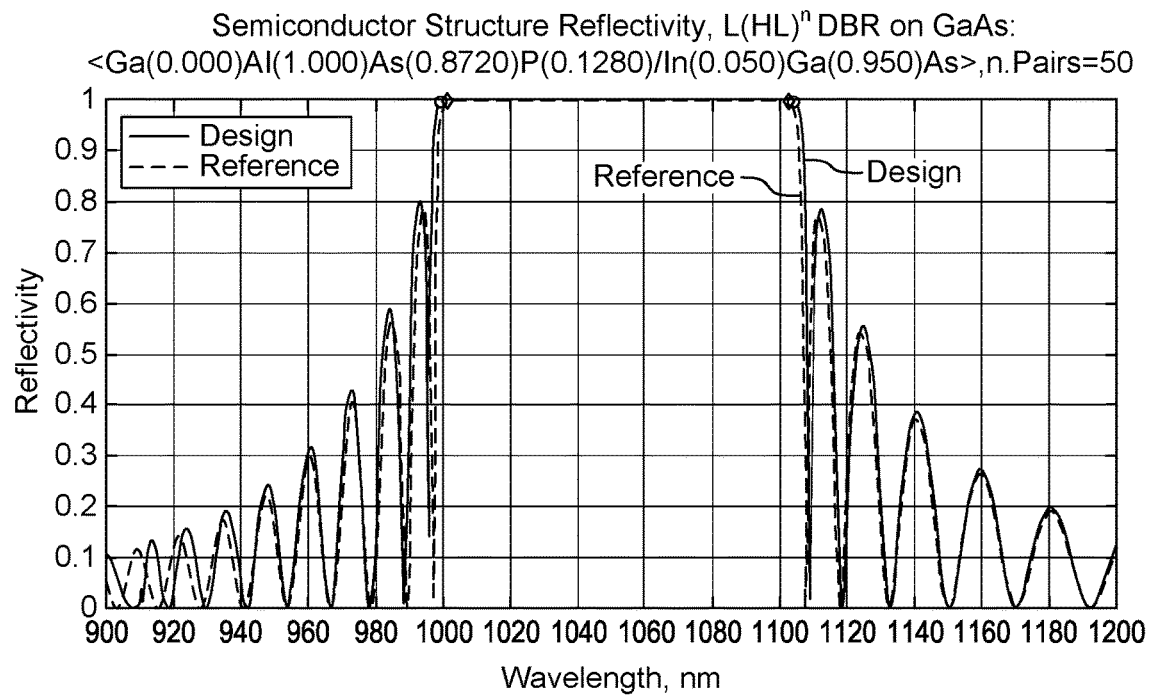
FIGS. 2A and 2B are plots of reflectivity as a function of wavelength in nanometers showing the improved reflectivity with a strain balanced DBR design using AlAsP/InGaAs, in which AlAs(0.872)P(0.128)/In(0.05)Ga(0.95)As, compared to a reference standard DBR design using AlAs/GaAs.
Figure 2B:
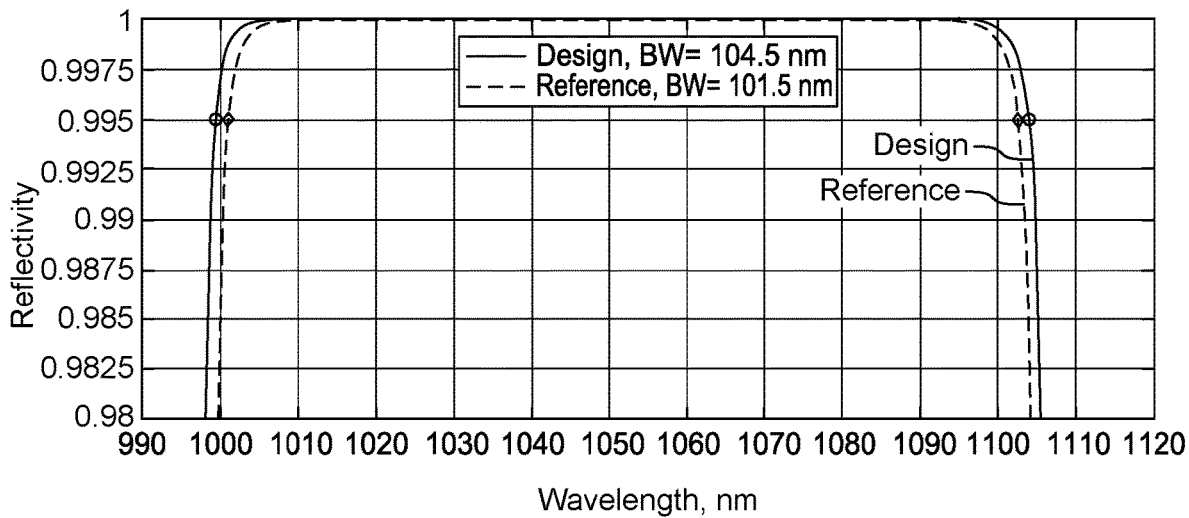

FIGS. 2A and 2B show the improved reflectivity with a strain balanced DBR design using AlAsP/InGaAs, in which AlAs(0.872)P(0.128)/In(0.05)Ga(0.95)As. This is compared to a reference standard DBR design using AlAs/GaAs.

The mirrors have 50 pairs. The strain compensation is H=InGaAs=compressive, and L=AlAsP=tensile.

As demonstrated by the plots, the strain balanced DBR bandwidth increases to 104.5 nm, compared with the 101.5 nm bandwidth of standard GaAs/AlAs DBR mirror on GaAs.

In addition, these principles can be extended to combined gain and DBR mirror structures as disclosed in U.S. patent application Ser. No. 16/993,953, filed on Aug. 14, 2020, now U.S. Pat. Appl. Pub. No.: US 2021/0050712, by Johnson, Kuznetsov and Whitney, which is incorporated herein by this reference.

FIG. 3 shows a design for the layer structure of a half VCSEL employing a combined gain and DBR mirror employing a mirror using GAlAsP/InGaAs.

This compound mirror includes 2 layers, 20-21, to form the window 124. The final epitaxial window layer 21 has InGaP composition lattice matched to GaAs. Such material has large bandgap to prevent excited electron-hole carriers from reaching the surface. Chemically, InGaP layers do not oxidize in contact with air and are preferred to AlGaAs window layers, which can experience such detrimental oxidation.

Layers 1-19 form the compound mirror of a passive DBR mirror 126, layers 1-2, and an active semiconductor gain mirror region 122, layers 3-19. Layer pair 1-2, repeated multiple times, includes GaAlAsP (Low index) and InGaAs (High index) layers that form a passive DBR mirror without gain. Layers 3-19 form a Gain-Embedded-DBR (GEDBR) active mirror region with reflection gain, which is formed on top of the passive DBR mirror. Here, InGaAs gain quantum well layers (5, 9, 13, 17) are inserted inside the GaAs layers of the GaAlAsP (Low index)/GaAs (High index) mirror layer pairs of this active mirror-with-gain GEDBR region. Other compositions of the GEDBR H-layers are also possible, such as AlGaAs. Use of such active gain GEDBR mirror structure enables shorter TVCSEL laser cavities, with consequently larger FSR longitudinal mode spacing and a wider allowed tuning range.

A further innovation to increase the DBR bandwidth involves expanding the material system to eliminate strain of high-index layers.

DBR mirrors constructed from GaAs/(Ga)AlAs, (H/L), have large cumulative built-in strain.

On the other hand, InGaAs/(Ga)AlAsP DBR mirrors can have zero-balanced cumulative strain. Moreover, the reduced bandgap of InGaAs, compared to GaAs, and increased bandgap of (Ga)AlAsP, compared to (Ga)AlAs, gives larger refractive index contrast and larger spectral bandwidth than GaAs/(Ga)AlAs based DBR mirrors.

InGaAs/(Ga)AlAsP layer pair has a zero-balanced strain, with compressive strain of InGaAs H-layer compensated by the tensile strain of (Ga)AlAsP L-layer. However, individual InGaAs layers are still strained, and critical, maximum, strain-thickness product of these layers limits the amount of bandgap reduction that can be achieved, and thus limits the increase of DBR mirror bandwidth.

To overcome this limitation, the material system is further expanded to include InGaAsN dilute nitrides, with the addition of Nitrogen N to InGaAs H-layers. Such dilute nitride materials can be grown lattice matched to GaAs, thus allowing maximum bandgap reduction and increase of DBR spectral bandwidth, which is now limited only by the requirement of non-absorbing mirror layers at the laser wavelengths.

Also, adding some antimony Sb to dilute nitrides InGaAsN forms quinary alloys InGaAsNSb. Such quinary alloy InGaAsNSb materials allow epitaxial growth of lower defect and higher quality heterostructures on GaAs with bandgaps down to 0.8 eV, with correspondingly large refractive index. Quinary alloy InGaAsNSb materials can also be used as High index materials for high-quality high-index-contrast DBR mirrors. A reference on dilute nitrides is Mircea Guina et al., "Molecular Beam Epitaxy of Dilute Nitride Optoelectronic Devices," in "Molecular Beam Epitaxy", second edition, Mohamed Henini ed., Elsevier Inc, 2018.

InGaAsN(Sb)/(Ga)AlAsP DBR mirrors can be grown with both H/L layers substantially lattice matched to GaAs. This eliminates both individual layer strain and the requirement to compensate structure strain by alternating relatively large compressive/tensile strain of individual layers. Alternatively, strain-compensated structures with low individual layer strains can also be grown in this material system. DBR spectral bandwidth in this material system can be larger than for GaAs/(Ga)AlAs(P) DBR mirrors.

Figure 4A:
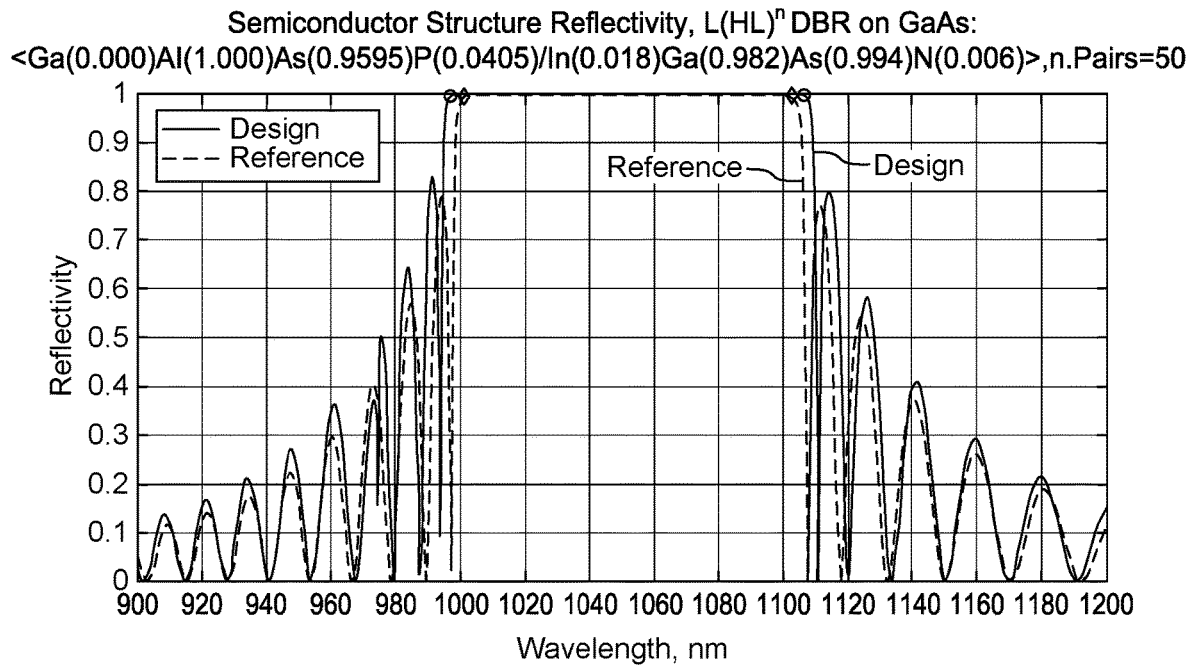
FIGS. 4A and 4B are plots of reflectivity as a function of wavelength nanometers showing the improved reflectivity with a dilute nitride DBR design, AlAsP/InGaAsN: AlAs (0.9595)P(0.0405)/In(0.018)Ga(0.982)As (0.994)N(0.006) compared to a reference standard DBR design using AlAs/GaAs.
Figure 4B:
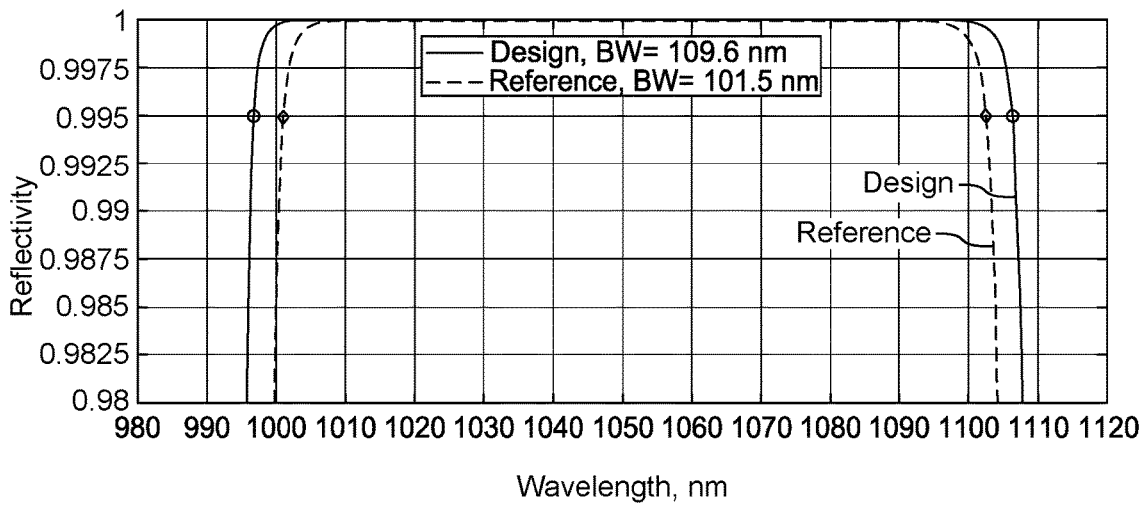

FIGS. 4A and 4B show the improved reflectivity with a dilute nitride DBR design, AlAsP/InGaAsN: AlAs(0.9595)P(0.0405)/In(0.018)Ga(0.982)As (0.994)N(0.006). This is compared to a reference standard DBR design using AlAs/GaAs.

The mirrors have 50 pairs. (H) InGaAsN and (L) AlAsP both lattice matched to GaAs. As shown, the dilute nitride DBR bandwidth increases to 109.6 nm, compared with the 101.5 nm bandwidth of standard GaAs/AlAs DBR mirror on GaAs.

FIG. 5 shows a design for the layer structure of a half VCSEL employing a combined gain and DBR mirror, employing InGaAsN(Sb) and (L) GaAlAsP based mirrors.

Layers 1-19 form the compound mirror having a passive DBR mirror 126, layers 1-2, and an active semiconductor gain mirror region 122, layers 3-19. Layer pair 1-2, repeated multiple times, includes GaAlAs(P) (Low index) and InGaAsN(Sb) (High index) layers that form a passive DBR mirror without gain. Layers 3-19 form a Gain-Embedded-DBR (GEDBR) active mirror region with reflection gain, which is formed on top of the passive DBR mirror. Here, InGaAs gain quantum well layers (5, 9, 13, 17) are inserted inside the GaAs layers of the GaAlAs(P) (Low index)/GaAs (High index) mirror layer pairs of this active mirror-with-gain GEDBR region.

Other compositions of the GEDBR H-layers are also possible, such as AlGaAs. Such GaAlAs(P)/InGaAsN(Sb) composition mirrors allow independent adjustment of mirror layer strain and mirror layer bandgap/refractive index. This gives a much wider design space for DBR mirror mechanical and optical properties, such as individual layer and cumulative mechanical strain and strain compensation, and optical reflection bandwidth. Gain Embedded DBR regions also benefit from using the wider design space materials. Use of such active gain GEDBR mirror structure enables shorter TVCSEL laser cavities, with consequently larger FSR longitudinal mode spacing and a wider allowed tuning range.

While this invention has been particularly shown and described with references to preferred embodiments thereof, it will be understood by those skilled in the art that various changes in form and details may be made therein without departing from the scope of the invention encompassed by the appended claims.

What is claimed is:

1. A laser including a semiconductor distributed Bragg reflector mirror, wherein the mirror comprises:
   a GaAs substrate; and
   a plurality of layers disposed on the GaAs substrate, the plurality of layers comprising layers of compressive InGaAs alternating with layers of tensile AlAsP or GaAlAsP.

2. The laser as claimed in claim 1, wherein the layers of compressive InGaAs alternating with the layers of tensile AlAsP or GaAlAsP produce substantially low cumulative combined strain on the GaAs substrate.

3. The laser as claimed in claim 1, further comprising quantum well layers for providing gain.

4. The laser as claimed in claim 3, wherein the quantum well layers are interspersed with the InGaAs and AlAsP or GaAlAsP layers.

5. The laser as claimed in claim 1, wherein the laser is a vertical cavity surface emitting laser.

6. The laser as claimed in claim 5, wherein the laser is a tunable vertical cavity surface emitting laser.

7. The laser as claimed in claim 6, wherein the laser includes a MEMS membrane including a reflective coating defining an end of the laser cavity.

8. A semiconductor distributed Bragg reflector mirror, wherein the mirror comprises:
   a GaAs substrate; and
   a plurality of layers disposed on the GaAs substrate, the plurality of layers comprising layers of compressive InGaAs alternating with layers of tensile AlAsP or GaAlAsP.

9. The mirror as claimed in claim 8, wherein the layers of compressive InGaAs alternating with the layers of tensile AlAsP or GaAlAsP produce substantially low cumulative combined strain on the GaAs substrate.

10. A laser including a semiconductor distributed Bragg reflector mirror, wherein the mirror comprises:
   a GaAs substrate; and
   a plurality of layers disposed on the GaAs substrate, the plurality of layers comprising layers of compressive InGaAs or InGaAsN (Sb) alternating with layers of tensile AlAsP or GaAlAsP.

\* \* \* \* \*